United States Patent
Bickford et al.

[11] Patent Number: 5,949,272
[45] Date of Patent: Sep. 7, 1999

[54] BIDIRECTIONAL OFF-CHIP DRIVER WITH RECEIVER BYPASS

[75] Inventors: Harry Randall Bickford, Ossining; Paul William Coteus, Yorktown Heights, both of N.Y.; Warren Edward Maule, Cedar Park; Robert Dominick Mirabella, Round Rock, both of Tex.

[73] Assignee: International Business Machines Corporation, Armonk, N.Y.

[21] Appl. No.: 08/873,830

[22] Filed: Jun. 12, 1997

[51] Int. Cl.$^6$ .................................................. H03K 17/62
[52] U.S. Cl. .............................................. 327/407; 327/99
[58] Field of Search ............................. 327/99, 407, 408, 327/410; 365/189.02, 230.02, 194; 326/63, 68, 80, 81, 82, 83, 86

[56] References Cited

U.S. PATENT DOCUMENTS

| | | |
|---|---|---|
| 4,703,198 | 10/1987 | Porter et al. ............................ 307/473 |
| 5,202,593 | 4/1993 | Huang et al. ........................... 307/475 |
| 5,359,235 | 10/1994 | Coyle et al. .......................... 307/296.1 |
| 5,406,147 | 4/1995 | Coyle ...................................... 327/51 |
| 5,436,574 | 7/1995 | Veenstra ................................. 327/407 |
| 5,461,330 | 10/1995 | Gist et al. ................................ 326/17 |
| 5,477,545 | 12/1995 | Huang ..................................... 371/22.3 |
| 5,479,123 | 12/1995 | Gist et al. ............................... 327/108 |
| 5,604,452 | 2/1997 | Huang ..................................... 327/407 |
| 5,621,694 | 4/1997 | Sakugawa et al. ................. 365/189.02 |
| 5,699,530 | 12/1997 | Rust et al. .......................... 365/189.02 |
| 5,781,560 | 7/1998 | Kawano et al. ..................... 371/22.32 |

*Primary Examiner*—My-Trang Nu Ton
*Attorney, Agent, or Firm*—Robert V. Wilder

[57] ABSTRACT

A method and apparatus are provided which are implemented in a chip I/O buffer-multiplexor circuit or I/O buffer cell 201. The I/O buffer portion includes a receiver circuit 205 for receiving bus input signals to the buffered chip, and a driver circuit 203 for driving output signals from the buffered chip to a data bus. An integrated multiplexor or MUX circuit 207 selectively gates one of three possible signals to chip internal logic. The three signals applied to the MUX circuit include a boundary scan test signal BS MUX for testing scan points in an integrated circuit, a bypass Data In signal DI which is generated by chip internal drive logic, and a DQ signal received by the I/O buffer receiver circuit from a data bus. The data input node of the I/O buffer is wired directly to the new multiplexor data input. Additional control signals are provided for orthogonal selection of the three multiplexor data inputs.

8 Claims, 4 Drawing Sheets

| BS IN SEL | TEST OVD | INH | DATAIN |
|---|---|---|---|
| 1 | 0 | 0 | DI |
| 1 | X | 1 | DOUT (RECEIVER) |
| 1 | 1 | X | DOUT (RECEIVER) |
| 0 | X | X | $\overline{\text{BS MUX}}$ |

BIDIRECTIONAL OFF-CHIP DRIVER WITH RECEIVER BYPASS

FIELD OF THE INVENTION

The present invention relates generally to information processing systems and more particularly to an improved method and apparatus for transferring digital signals between integrated circuits.

BACKGROUND OF THE INVENTION

In digital electronic systems, bi-directional off-chip driver/receiver circuits, or I/O buffers, are used to transfer digital signals between integrated circuit chips connected to a common bus. The I/O buffers give each chip a capability to present digital information to the bus in drive mode, as well as to "listen" for data on the bus in the receive mode. When data is to be driven onto the bus, the integrated circuit or chip internal drive logic will present the data input signal DI to an input node of an I/O buffer. The driver is controlled by an inhibit signal INH, and when the inhibit signal INH is disabled, the data input signal DI will be propagated to the I/O data output node providing a data output signal DOUT, for driving off-chip. The DOUT node is connected to a chip I/O pad. When the inhibit node is enabled, the driver output is put into a high impedance state allowing the input buffer to receive signals from the bus at the DOUT pin. The receiver output is presented to the chip-internal receive logic at the DATA IN node.

To reduce component and system test complexity and cost, many system designs require each component to support boundary scan testing. Boundary scan techniques provide test access to chip-internal nodes, permit interconnect tests between components, and allow I/O buffers to be tested without having to contact the buffer pads. To accommodate boundary scan testing, a two-to-one multiplexor is added to the basic I/O buffer cell. The multiplexor provides a path for test data as well as functional data to be presented to the chip-internal receive logic. The paths through the multiplexor function are selected by an SEL node. To test the I/O buffer, the SEL pin is disabled allowing the test data present at the multiplexor node to be gated to the chip-internal receive logic at the DATA IN node. In operational mode, the SEL node is enabled thereby allowing data from the receiver input buffer to propagate to the DATA IN node.

In high performance digital systems, data processing associated with the chip-internal receive logic require that the data on the bus be sampled even when the chip is driving the bus. When the I/O buffer is driving, data presented to the DI node is propagated to the DOUT node as well as to the input of the receiver. The data propagates through the receiver and multiplexor, and is presented to the chip-internal receive logic at the DATA IN node. This mode of operation, however, creates several problems. The input receiver buffer is coupled to the same node as the chip I/O pad. The I/O pad is part of a transmission line involving other chips and their associated I/O pads and I/O buffer interconnections. When data is launched from the I/O buffer, signal reflections are produced on the bus due to impedance mismatches along the net. If the data is sampled at the source before the reflections are cancelled, erroneous signals could be captured creating data integrity problems for the chip-internal receive logic. To avoid that situation, the conventional approach is to bypass the input receive buffer using a multiplexor external to the I/O buffer cell. The inhibit pin will select the bypass path through the external multiplexor when the I/O buffer is in drive mode, providing a stable value of the driven data directly to the chip-internal receive logic.

There are, however, several drawbacks using the external multiplexor to accomplish the receiver bypass function. Each I/O buffer cell requires a two-to-one multiplexor circuit. For high I/O count chips, this can potentially use a significant amount of silicon area on the chip. Each multiplexor requires one connection to the I/O buffer cell and three connections to the chip-internal receive logic. These interconnects contribute to global wiring congestion within the chip. This, in turn, tends to make the task of wiring the chip more difficult and can even force other global wire interconnections to become longer due to increased congestion. The multiplexor interconnect wire RC delay as well as the propagation delay through the multiplexor circuit itself, add to the overall delay of the bypass path. The external multiplexor creates an additional load capacitance on the chip-internal drive logic that generates the D1 signal thereby adding further delay to the path. The chip-internal receive logic processing that uses the driven data, tend to be timing-critical. Therefore it is imperative that the receiver bypass delay be as small as possible so as not to lengthen the chip clock cycle time which would degrade system performance. Accordingly, there is a need for an enhanced method and apparatus which is effective to implement the above described receiver bypass function, while at the same time reducing the signal propagation delay and wire congestion penalties typically incurred in connection with conventional and previous receiver bypass designs, as well as minimizing chip silicon area requirements.

SUMMARY OF THE INVENTION

A method and apparatus is provided which incorporates a multiplexor circuit with driver and receiver circuits to form an integrated I/O buffer cell for connection between integrated circuit chips within an information processing system. The I/O buffer cell services a receiver bypass function, a boundary scan test function and a receiver input function by means of a single integrated multiplexor connected together with I/O buffer driver and receiver circuitry.

BRIEF DESCRIPTION OF THE DRAWINGS

A better understanding of the present invention can be obtained when the following detailed description of a preferred embodiment is considered in conjunction with the following drawings, in which:

FIG. 5 is a Truth Table for the I/O buffer muliplexor function implemented in the disclosed exemplary embodiment.

DETAILED DESCRIPTION

Figure 1:
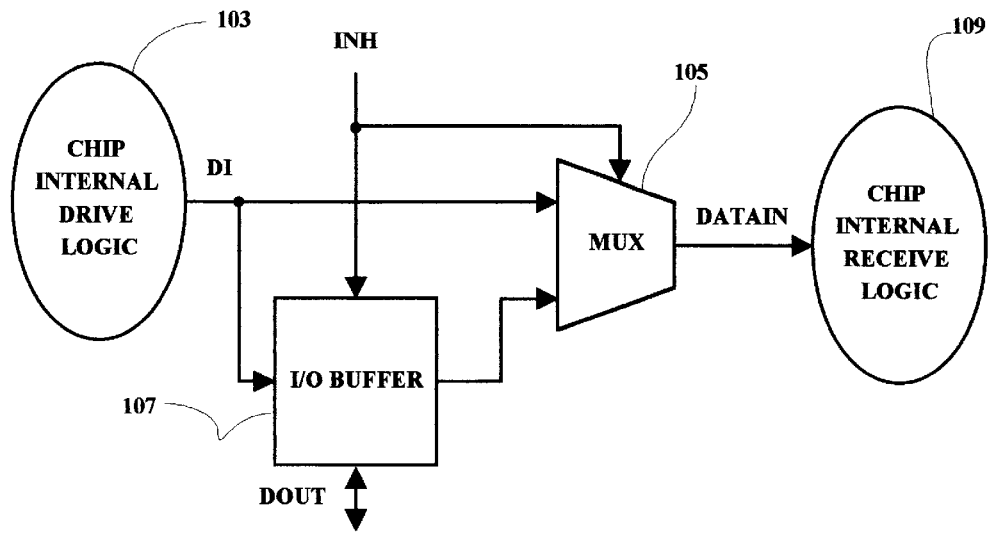
FIG. 1 is a prior art I/O buffer cell and external receiver bypass multiplexor.

In FIG. 1, internal drive logic circuitry 103 for a system integrated circuit or "chip" is shown providing a data-in signal DI to an I/O buffer circuit 107. The I/O buffer circuit 107 typically includes a driver circuit and a receiver circuit. An output of the I/O buffer circuit provides one input to a two input external bypass multiplexor circuit, or MUX, 105. The other input terminal to the bypass MUX 105 is arranged to be connected to the DI node of the chip internal drive logic 103. The I/O buffer circuit 107 also receives an "inhibit" signal INH. The INH signal is also applied to the select terminal for the multiplexor 105. The output of the multiplexor 105 is applied to chip internal receive logic circuitry 109. The I/O buffer 107 also has an I/O node DOUT which is typically connected to a bus for transferring digital signals between the logic circuitry 103 and 109 and other integrated circuit chips in a system. When data is to be driven on to the bus, the chip internal drive logic 103 will present the data signal to the input node DI of the I/O buffer. The driver circuit within the I/O buffer is controlled by the inhibit signal INH.

When INH is disabled, the signal at the DI pin will be propagated to the I/O node DOUT for driving off-chip devices. The DOUT node is connected to a chip I/O pad. When the INH pin is enabled, the driver output (within the buffer 107) is put into a high impedance state allowing the input buffer receiver circuitry to receive signals from the bus at the I/O pin. The I/O buffer receiver output is applied to the bypass MUX circuit 105 for selective application to the chip-internal receive logic 109 at the DATAIN node. The INH pin will select the bypass path through the external bypass multiplexor 105, thus bypassing the I/O buffer, when the I/O buffer is in the drive mode, thereby providing a stable value of the driven data DI directly to the chip-internal receive logic. The external MUX receiver bypass circuitry shown in FIG. 1 has an inherent disadvantage since each I/O buffer cell requires a two-to-one multiplexor circuit. For high I/O chip counts, this can potentially use up a significant amount of silicon area on the chip. Each multiplexor requires one connection to the I/O buffer cell and three connections to the chip-internal logic. Such interconnects contribute to global wiring congestion within the chip and add to the overall delay of the bypass path.

Figure 2:
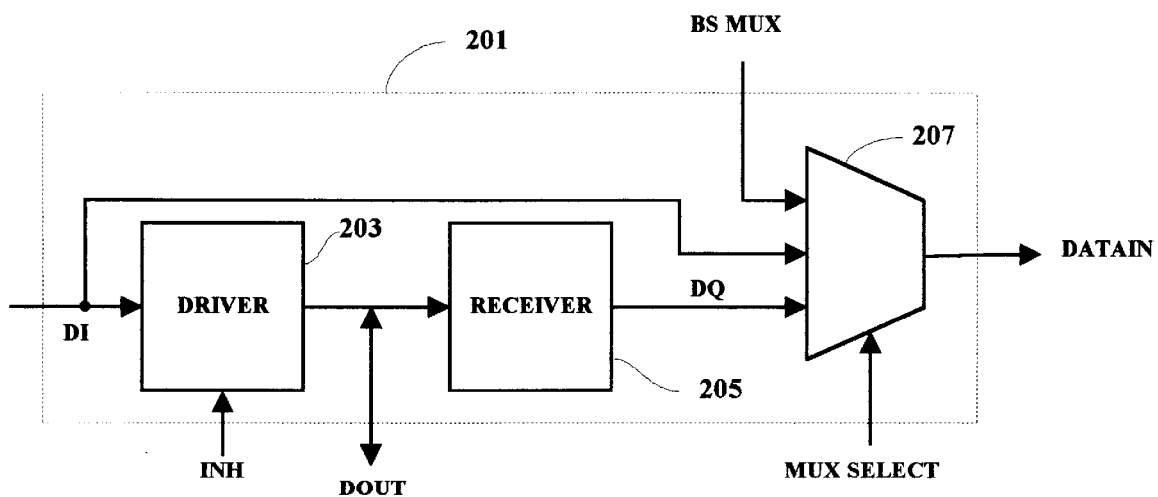
FIG. 2 is a simplified functional block diagram of an I/O buffer cell with integrated boundary scan test and receiver bypass support.

In accordance with the present invention, the external MUX circuit is eliminated and the bypass function is accomplished with a modified boundary scan multiplexor or MUX circuit as illustrated in the functional block diagram of FIG. 2. In FIG. 2, there is shown a functional block diagram of an I/O buffer cell 201 with integrated boundary test scan and receiver bypass support. The DI node is applied to a driver circuit 203 which is coupled through a receiver circuit 205 to provide a DQ signal to one input of a three-input multiplexor circuit 207. The DOUT node is connected between the driver circuit 203 and the receiver circuit 205, and the chip I/O pad. The driver circuit also receives the INH signal. A second input to the multiplexor 207 also receives the DI signal through a bypass path from the DI input. A third input terminal to the multiplexor 207 receives a BS (boundary scan) MUX signal. The MUX circuit 207 receives MUX Select signals which are effective to determine which of the three input signals is applied at the DATAIN output. Thus multiplexor 207 is effective to accomplish both the bypass function when the I/O buffer is in the drive mode, and also the boundary scan testing function of the chip, in addition to the normal receive function when the I/O buffer is in the receive mode.

Figure 3:
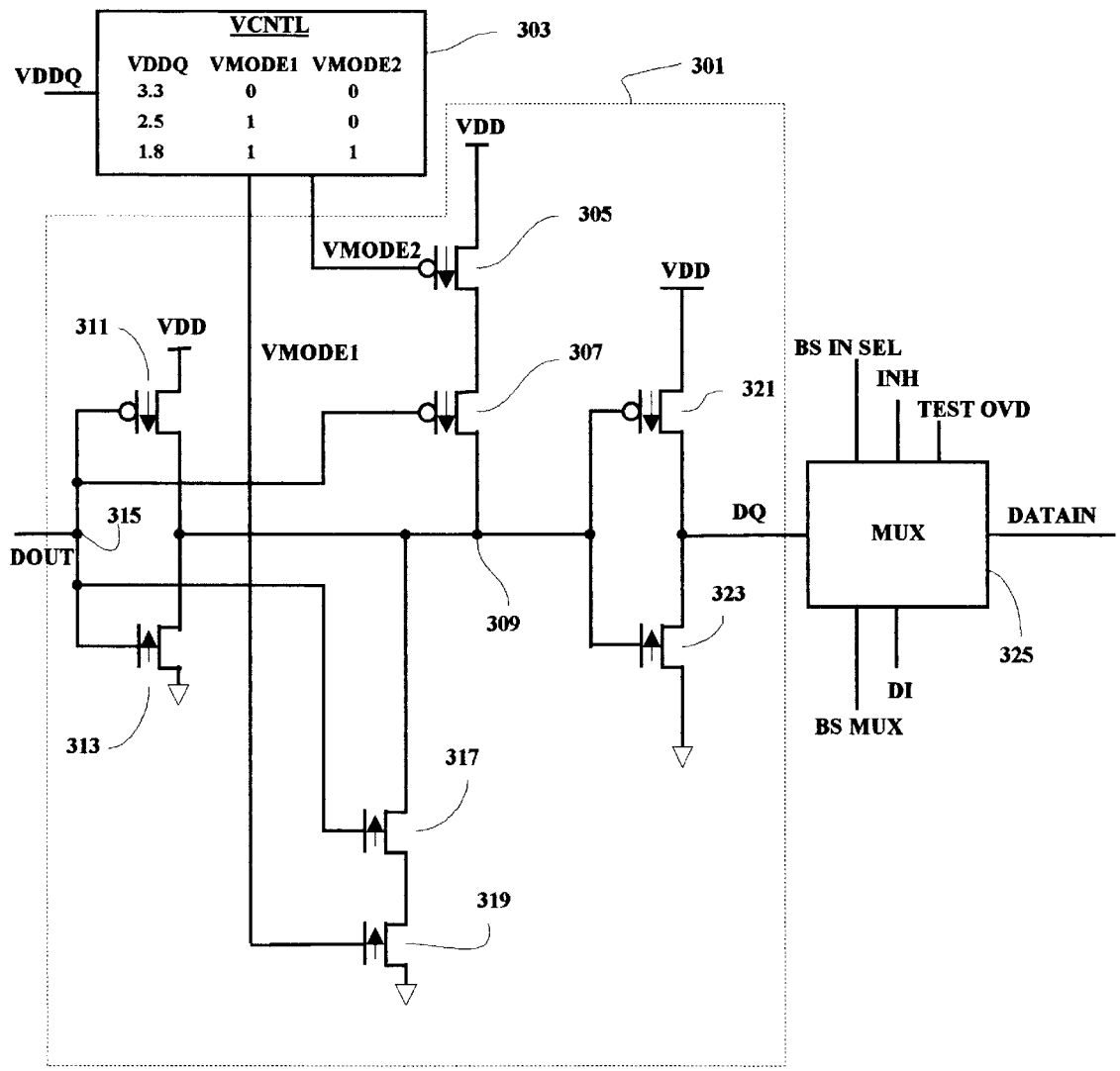
FIG. 3 is a simplified schematic diagram of an exemplary receiver circuit as shown in FIG. 2.
Figure 4:
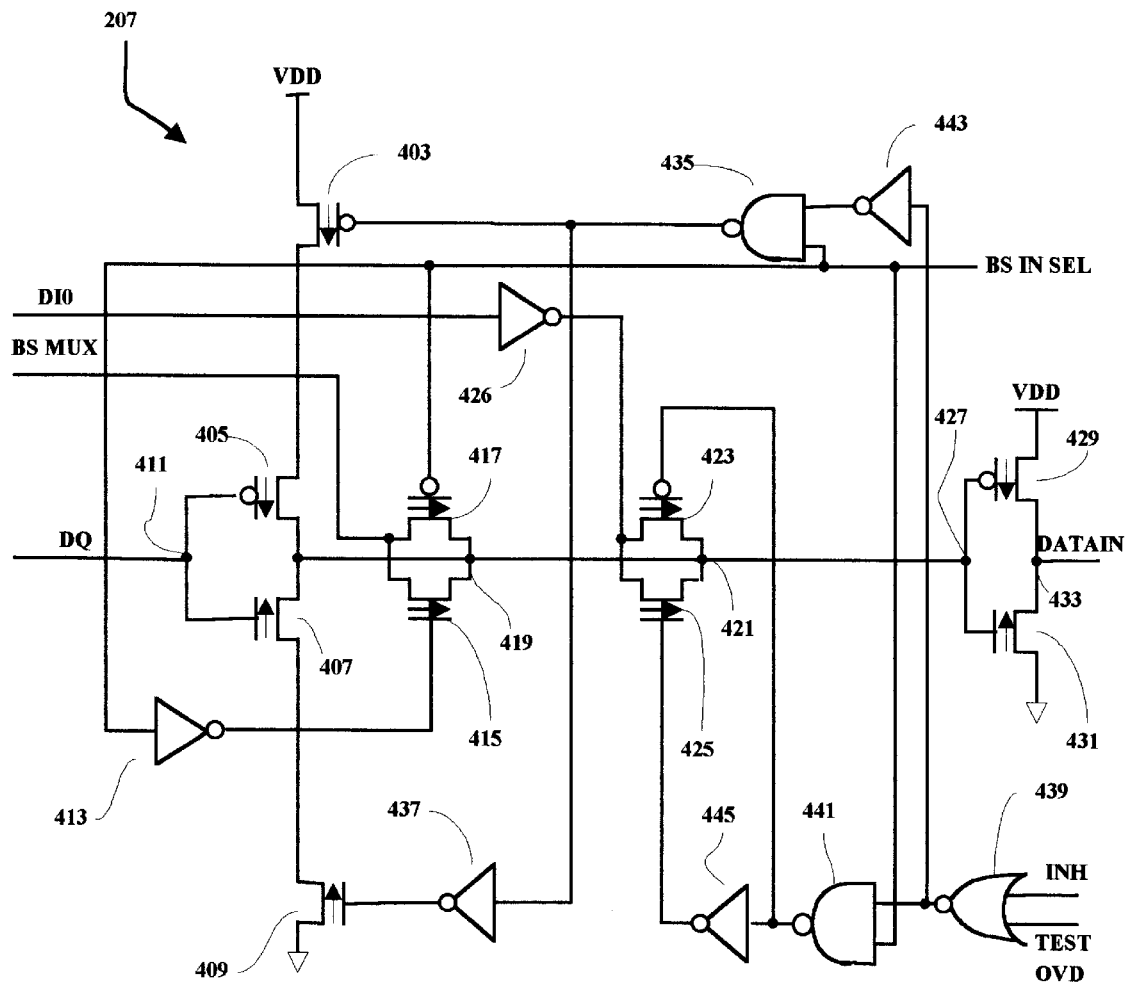
FIG. 4 is a simplified schematic diagram of an exemplary multiplexor circuit as shown in FIG. 2.

The schematics for the receiver circuit 205 and the multiplexor circuit 207 are shown in FIG. 3 and FIG. 4, respectively. In FIG. 3, a receiver circuit 301 receives VMODE1, and VMODE2 signals in accordance with the VCNTL table 303 in response to a VDDQ signal. In the receiver circuit 301, PFET transistors 305 and 307 are connected between VDD and a first node 309. Node 309 is connected to a common point between PFET and NFET transistors 311 and 313, respectively, which are serially connected between VDD and a common ground connection. The input terminals for transistors 311 and 313 are connected together to receive a DOUT signal at a DOUT node 315. NFET transistors 317 and 319 are connected in series between the common point 309 and ground. The input or gate terminal for transistor 317 is connected to the DOUT node 315 and the input terminal for transistor 319 is connected to receive the VMODE1 signal. The DOUT node 315 is also connected to the input or gate terminal of transistor 307, and the gate terminal of transistor 305 is connected to receive the VMODE2 signal.

PFET transistor 321 and NFET transistor 323 are serially connected between VDD and ground, and the gate terminals of the transistors 321 and 323 are connected together and to common point or node 309. The common point or node DQ between the output terminals of transistors 321 and 323 is connected to a multiplexor circuit 325. The multiplexor circuit 325 is arranged to receive signals BS IN SEL, INH, BS MUX, DI, TEST OVD (Test Override) and DQ signals and provide output signal DATAIN which is applied to an input to chip internal receive logic (not shown).

In FIG. 4, the schematic diagram of the multiplexor circuit 207 is shown. PFET transistors 403 and 405 are connected in series between VDD and a common point or node 419. NFET transistors 407 and 409 are serially connected between the node 419 and ground. The input or gate terminals of transistors 405 and 407 are connected together to receive signal DQ at node DQ 411. Boundary Scan Input Select signal BS IN SEL is connected through an inverter 413 to an input terminal of an NFET transistor 415. Transistor 415 and PFET transistor 417 are connected in parallel between the BS MUX node and a common point or node 419. Transistor 417 has its gate terminal connected to receive the BS IN SEL signal. Common point 419 is connected to common point 421 and further to common point 427. PFET transistor 423 and NFET transistor 425 are connected in parallel between common point 421 and the output terminal of an inverter circuit 426. The input of inverter circuit 426 is arranged to receive the DI0 signal.

PFET transistor 429 is serially connected with NFET transistor 431 between VDD and ground. The common point 433 between the output terminals of transistors 429 and 431 is connected to the DATAIN node to provide the DATAIN signal to the chip internal receive logic. The gate terminals of transistors 429 and 431 are connected together and to common point 427. A NOR gate 439 receives input signals INH and TEST OVD and has its output terminal connected to one input of a two-input NAND gate 441. The second input to the NAND gate 441 is arranged to receive the BS IN SEL signal. The output of the NAND gate 441 is connected to the gate terminal of transistor 423 and also through an inverter circuit 445 to the gate terminal of transistor 425. The output terminal of the NOR gate 439 is also connected through an inverter circuit 443 to one input of a NAND gate 435. The other input to the NAND gate 435 is connected to receive the BS IN SEL signal. The output terminal of the NAND gate 435 is connected to the gate terminal of transistor 403 and also through an inverter circuit 437 to the gate terminal of transistor 409.

In operation, the multiplexor function utilizes complementary passgate devices to gate the test data input BS MUX and the bypass input DI to the multiplexor output node DATAIN. The passgate devices consist of an NFET and a PFET device with their sources and drains in common, and with complementary control signals enabling or disabling both devices simultaneously. The passgate implementation allows data to propagate through the multiplexor faster than would be realized using a typical static gate structure. In addition, using passgates for logic functions such as multiplexors, require fewer transistors than in static gate implementations. An additional test input TEST OVD is provided for enabling the conventional driver to receiver path DOUT to DATAIN when the I/O buffer is driving. The test override pin can be enabled during wafer test to perform I/O wrap testing. This allows testing of the I/O buffer circuit without having to contact the I/O pad DOUT. The truth table for the multiplexor function is shown in FIG. 5 and indicates the values of DATAIN for various combinations of values of BS IN SEL, TEST OVD, and INH.

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art, and even included or integrated into a processor or CPU or other larger system integrated circuit or chip. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A buffer circuit for connection between an integrated circuit and a bus, said buffer circuit comprising:

a multiplexor circuit having first, second and third input terminals, a multiplexor select input and a multiplexor output terminal, said first second and third input terminals of said multiplexor circuit being connected to receive first second and third multiplexor input signals; and a coupling circuit for selectively applying a driven data bypass signal, and a receiver output signal, respectively, to said first and second input terminals of said multiplexor circuit, said multiplexor circuit being connected for receiving a scan test signal at said third input terminal of said multiplexor circuit, said multiplexor circuit being selectively operable, in response to select signals applied to said multiplexor select input, for providing one of said multiplexor input signals to said output terminal of said multiplexor circuit, said multiplexor select input further including means for receiving an inhibit signal, said multiplexor circuit being responsive to said inhibit signal for providing said driven data bypass signal at said output terminal of said multiplexor circuit.

2. A buffer circuit for connection between an integrated circuit and a bus, said buffer circuit comprising:

a multiplexor circuit having first, second and third input terminals, a multiplexor select input and a multiplexor output terminal, said first second and third input terminals of said multiplexor circuit being connected to receive first second and third multiplexor input signals; and a coupling circuit for selectively applying a driven data bypass signal, and a receiver output signal, respectively, to said first and second input terminals of said multiplexor circuit, said multiplexor circuit being connected for receiving a scan test signal at said third input terminal of said multiplexor circuit, said multiplexor circuit being selectively operable, in response to select signals applied to said multiplexor select input, for providing one of said multiplexor input signals to said output terminal of said multiplexor circuit, said multiplexor select input further including means for receiving a test override signal, said multiplexor circuit being responsive to said test override signal for enabling a driver to receiver path when said buffer circuit is driving.

3. A buffer circuit for connection between an integrated circuit and a bus, said buffer circuit comprising:

a multiplexor circuit having first, second and third input terminals, a multiplexor select input and a multiplexor output terminal, said first second and third input terminals of said multiplexor circuit being connected to receive first second and third multiplexor input signals; and a coupling circuit for selectively applying a driven data bypass signal, and a receiver output signal, respectively, to said first and second input terminals of said multiplexor circuit, said multiplexor circuit being connected for receiving a scan test signal at said third input terminal of said multiplexor circuit, said multiplexor circuit being selectively operable, in response to select signals applied to said multiplexor select input, for providing one of said multiplexor input signals to said output terminal of said multiplexor circuit, said coupling circuit further including:

a driver circuit operable to receive said driven data signal from said integrated circuit at an input terminal of said driver circuit, and provide a driven output signal to said bus; and a bypass connection between said input terminal of said driver circuit and said multiplexor circuit for providing said driven data signal to said multiplexor circuit.

4. The buffer circuit as set forth in claim 3 and further including:

a receiver circuit connected between said driver circuit and said multiplexor circuit, said receiver circuit being selectively operable to receive an input signal from said bus and provide said receiver output signal to said multiplexor circuit.

5. A buffer circuit for connection between an integrated circuit and a bus, said buffer circuit comprising:

a multiplexor circuit having first, second and third input terminals, a multiplexor select input and a multiplexor output terminal, said first second and third input terminals of said multiplexor circuit being connected to receive first second and third multiplexor input signals; and a coupling circuit for selectively applying a driven data bypass signal, and a receiver output signal, respectively, to said first and second input terminals of said multiplexor circuit, said multiplexor circuit being connected for receiving a scan test signal at said third input terminal of said multiplexor circuit, said multiplexor circuit being selectively operable, in response to select signals applied to said multiplexor select input, for providing one of said multiplexor input signals to said output terminal of said multiplexor circuit, wherein said multiplexor circuit is implemented using complementary passgate devices to selectively gate said scan test signal to said output terminal of said multiplexor circuit.

6. The buffer circuit as set forth in claim 5 wherein said multiplexor circuit is implemented using complementary passgate devices to selectively gate said driven data bypass signal to said output terminal of said multiplexor circuit.

7. A buffer circuit for connection between an integrated circuit and a bus, said buffer circuit comprising:

a multiplexor circuit having first, second and third input terminals, a multiplexor select input and a multiplexor output terminal, said first second and third input terminals of said multiplexor circuit being connected to receive first second and third multiplexor input signals; and a coupling circuit for selectively applying a driven data bypass signal, and a receiver output signal, respectively, to said first and second input terminals of said multiplexor circuit, said multiplexor circuit being connected for receiving a scan test signal at said third input terminal of said multiplexor circuit, said multiplexor circuit being selectively operable, in response to select signals applied to said multiplexor select input, for providing one of said multiplexor input signals to said output terminal of said multiplexor circuit, wherein said multiplexor circuit is implemented using complementary passgate devices to selectively gate said driven data bypass signal to said output terminal of said multiplexor circuit.

8. A method for connecting an integrated circuit to a bus, said method comprising:

applying a data signal from the integrated circuit to a driver circuit, said driver circuit being responsive to said data signal for providing a driven output signal for application to the bus;

applying a bus signal received from said bus to one input of a three input multiplexor circuit;

applying said data signal directly to a second input of said multiplexor circuit; and applying a scan test signal to a third input of said multiplexor circuit, said multiplexor circuit being selectively operable for providing a selected one of said bus signal, said data signal or said scan test signal, at an output terminal of said multiplexor circuit; and applying an inhibit signal to said multiplexor circuit, said multiplexor circuit being responsive to said inhibit signal for providing a driven data bypass signal at said output terminal of said multiplexor circuit.

* * * * *